US010302676B2

(12) United States Patent
Mende et al.

(10) Patent No.: US 10,302,676 B2
(45) Date of Patent: May 28, 2019

(54) FLEXIBLE RESISTIVE TIP CABLE ASSEMBLY FOR DIFFERENTIAL PROBING

(71) Applicant: Tektronix, Inc., Beaverton, OR (US)

(72) Inventors: Michael J. Mende, Portland, OR (US); Gary W. Reed, Oakdale, CA (US); James D. Pileggi, Beaverton, OR (US); Karl A. Rinder, Beaverton, OR (US); Richard A. Booman, Lake Oswego, OR (US); Martin Van Pelt, Boulder, CO (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 15/259,818

(22) Filed: Sep. 8, 2016

(65) Prior Publication Data
US 2017/0271826 A1    Sep. 21, 2017

Related U.S. Application Data

(60) Provisional application No. 62/310,164, filed on Mar. 18, 2016.

(51) Int. Cl.
*G01R 1/067* (2006.01)
*H03H 1/00* (2006.01)
(Continued)

(52) U.S. Cl.
CPC .......... *G01R 1/06772* (2013.01); *G01R 1/18* (2013.01); *H01P 1/22* (2013.01); *H01P 1/225* (2013.01);
(Continued)

(58) Field of Classification Search
CPC  H01R 24/40; H01R 13/6461; H01R 2103/00; H01R 2201/20; H01P 1/22;
(Continued)

(56) References Cited

U.S. PATENT DOCUMENTS 4,267,529 A * 5/1981 Brun .................... H03H 1/0007
333/12
4,383,225 A * 5/1983 Mayer .................. H01B 11/146
174/36
(Continued)

FOREIGN PATENT DOCUMENTS

| DE | 102012207341 | 11/2013 |
|----|--------------|---------|
| EP | 1030182 | 8/2000 |
| EP | 2750150 | 7/2014 |

OTHER PUBLICATIONS

Maxim AN 2045,"Understanding Common-Mode Signals", Jun. 29, 2003, pp. 1-12.*
(Continued)

*Primary Examiner* — Benny T Lee
*Assistant Examiner* — Hafizur Rahman
(74) *Attorney, Agent, or Firm* — Miller Nash Graham & Dunn; Kevin D. Dothager; Andrew J. Harrington

(57) ABSTRACT

A flexible resistive tip cable assembly includes a probe Radio Frequency (RF) connector structured to receive a RF differential signal and a testing connection assembly. A coaxial cable is structured to conduct the RF differential signal between the probe RF connector and the testing connection assembly. The coaxial cable includes a cable for conducting the differential signal, and a plurality of magnetic elements positioned along a length of the cable and structured to isolate the differential signal from common mode interference. The magnetic elements are separated from adjacent magnetic elements by a gap with elastomeric elements is positioned in each gap to provide cable flexibility. The assembly may also include an Electrically Erasable Programmable Read Only Memory (EEPROM) loaded with
(Continued)

an attenuation associated with the flexible resistive tip cable assembly for use in signal testing by a device coupled to the testing connection assembly.

12 Claims, 6 Drawing Sheets

(51) Int. Cl.
| | |
|---|---|
| *H01P 1/22* | (2006.01) |
| *G01R 1/18* | (2006.01) |
| *H01R 13/6461* | (2011.01) |
| *H01R 24/40* | (2011.01) |
| *H01R 103/00* | (2006.01) |

(52) U.S. Cl.
CPC ......... *H01R 13/6461* (2013.01); *H01R 24/40* (2013.01); *H03H 1/0007* (2013.01); *H01R 2103/00* (2013.01); *H01R 2201/20* (2013.01); *H03H 2001/0057* (2013.01)

(58) Field of Classification Search
CPC .............. H01P 1/225; H03H 1/0007; H03H 2001/0057; G01R 1/06772; G01R 1/18
USPC .......................................................... 333/12
See application file for complete search history.

(56) References Cited

U.S. PATENT DOCUMENTS

| | | | | |
|---|---|---|---|---|
| 6,469,594 | B1 * | 10/2002 | Ticarano | H01F 17/06 333/12 |
| 7,609,077 | B2 | 10/2009 | Campbell et al. | |
| 9,304,150 | B2 * | 4/2016 | Johnson | G01R 15/207 |
| 2005/0275565 | A1 * | 12/2005 | Nachtigal | C08L 67/00 341/16 |
| 2006/0290357 | A1 * | 12/2006 | Campbell | G01R 1/06766 324/600 |
| 2008/0084218 | A1 * | 4/2008 | Hailey | G01R 31/002 324/627 |
| 2017/0067940 | A1 * | 3/2017 | Chen | G01R 15/183 |

OTHER PUBLICATIONS

Application Note 1569, "Demystifying Deep Memory Oscilloscopes", Agilent Technologies, Jan. 30, 2008, pp. 1-6.*

EESR—European Patent Office, Extended European Search Report and Written Opinion for European Patent Application 17161687.3, dated Aug. 14, 2017, 9 pages, European Patent Office. Munich, Germany.

* cited by examiner

FLEXIBLE RESISTIVE TIP CABLE ASSEMBLY FOR DIFFERENTIAL PROBING

CROSS-REFERENCES TO RELATED APPLICATIONS

The present application claims benefit to U.S. Provisional Patent Application Ser. No. 62/310,164, filed Mar. 18, 2016, and entitled "Flexible Resistive Tip Cable Assembly For Differential Probing With High Common Mode Rejection And Other Potential Probing Applications," which is incorporated herein by reference as if reproduced in its entirety.

FIELD OF THE INVENTION

This disclosure is directed to a mechanism for signal probing, and, more particularly, to a flexible shielded probe cable for transmitting differential Radio Frequency (RF) signals for testing by a test and measurement system.

BACKGROUND

Various systems have been developed to test differential signals from a device under test (DUT). There are a variety of ways to connect the test system to the DUT. These may include a soldered connection, RF connector, pressure contacts, wires/leads, pins, adapters, interposers, clip-ons etc. A common interface to connect the test system to the DUT is accomplished by using a pair of pins/short wires that are soldered to the differential test points, which are then connected to the test system via a cable. The problem with such systems is that ambient electric fields may interact with the cable, which may lack sufficient shielding in some cases, causing interference with the signals. Interference with both signals is referred to as common mode interference. The poorly shielded cable may experience both common mode interference and interference affecting the individual wires/leads. There is no mechanism in the cable to isolate the differential signal from the interference occurring across the cable, resulting in added signal noise that is measured by the testing system but is not present in the DUT. As such, a poorly shielded cable reduces the accuracy of test measurements taken by a testing system, particularly when measuring a differential signal with higher frequency content.

Embodiments of the invention address these and other issues in the prior art.

SUMMARY OF THE DISCLOSURE

Embodiments of the disclosed subject matter include a flexible resistive tip cable assembly for differential probing. The flexible resistive tip cable assembly includes a coaxial cable structured to communicate an RF differential signal. The cable employs a plurality of magnetic elements posited along the entire length of the cable. The magnetic elements act as a distributed common mode choke. The magnetic elements are not flexible, so the magnetic elements are each separated by gaps. The gaps are filled with elastomeric elements that are compressible, which provides cable flexibility. The gaps are small to reduce the cable area without magnetic element coverage. For example, the length of the gaps may be about a third of the height of the magnetic elements to prevent the magnetic elements from rubbing together when the cable is bent. The cable includes a tip with a probe RF connector. The tip of the cable may also include an attenuator coupled to the probe RF connector to minimize/reduce the electrical loading on the signal wire. The cable also includes a testing connection assembly with a test RF connector that can be connected to a testing device. The testing connection assembly may include an Electrically Erasable Programmable Read Only Memory (EEPROM). The EEPROM is loaded with the measured attenuation of the attenuator and/or other parameters specific to the cable. In an embodiment, the testing device employs the information on the EEPROM to automatically adjust the differential signal to compensate for signal alterations occurring over the cable, resulting in a true signal at the testing device.

Accordingly, in at least some embodiments a flexible resistive cable assembly includes a probe RF connector structured to receive a RF differential signal and a testing connection assembly. The assembly also includes a coaxial cable structured to conduct the RF differential signal between the probe RF connector and the testing connection assembly. The coaxial cable includes a cable for conducting the differential signal, and a plurality of magnetic elements positioned along a length of the cable and structured to reduce/attenuate the common mode interference in order to reduce the coupling of the common mode interference into the differential signal.

In another aspect, in at least some embodiments a cable includes a center conductor structured to conduct a signal of a RF differential signal, the center conductor including a length and a diameter. The cable also includes a reference conductor structured to conduct a reference signal of the RF differential signal, the reference conductor including a length and a diameter. A plurality of magnetic rings are positioned along the length of the reference conductor and the length of the center conductor to reduce/attenuate the common mode interference in order to reduce the coupling of the common mode interference into the differential signal. Each magnetic ring is positioned to surround the diameter of the center conductor and the diameter of the reference conductor. The magnetic rings are each separated by a gap, and a plurality of elastomeric elements are positioned in the gaps between the magnetic rings.

DETAILED DESCRIPTION

As described herein, the embodiments of the disclosure are directed to a flexible resistive tip cable assembly for differential probing. The flexible resistive tip cable assembly, also known as a probe, includes a coaxial cable for conducting a differential signal. The cable is surrounded by a plurality of magnetic elements, which may be structured as rings. The magnetic elements act as a common mode choke. The magnetic elements are separated by gaps, which are filled with elastomeric elements. The elastomeric elements generally maintain spacing between the magnetic elements, but are compressible allowing the cable to bend. The probe may also include an attenuator to minimize/reduce electrical loading on the signal wire and promote signal isolation. Further, the probe may also include a memory that stores the attenuation of the attenuator as well as other tested parameters associated with the probe. Devices attached to the probe may use the stored data to compensate for signal alterations occurring in the probe. Accordingly, the probe provides an environment where the differential signal is highly shielded and alterations to the signal are pre-compensated, allowing the signal received by the testing device to mirror the signal in the DUT to a very high degree of accuracy.

Figure 1:
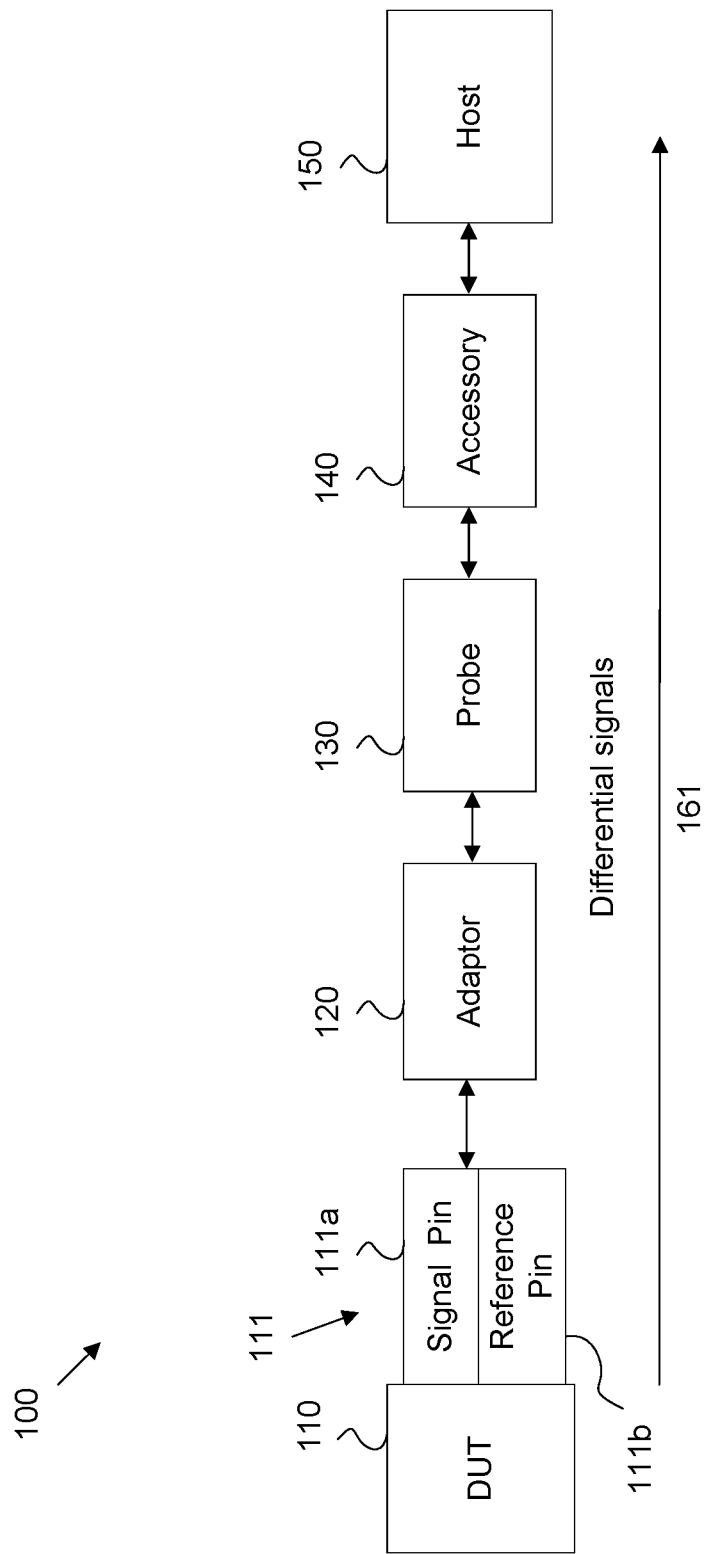
FIG. 1 is a schematic diagram of an embodiment of a test and measurement system.

FIG. 1 is a schematic diagram of an embodiment of a test and measurement system 100. System 100 includes a DUT 110 with a pair of differential pins 111. Differential signals 161 from the differential pins 111 are sent to the host 150 for testing. The differential signals 161 encode information as the difference between a signal traversing the signal pin 111a and a reference signal traversing the reference pin 111b. The host 150 is configured to receive differential signals 161. An adaptor 120 conducts signals traversing the two pins/leads into a coaxial connection to be sent to the host 150. The differential signals 161 are sent to the host 150 via a probe 130 and, in some embodiments, an accessory 140 that acts a controller and/or pre-processor for the host 150.

A DUT 110 is any device structured to generate differential signals 161 for testing. For example, a DUT 110 may include a circuit board with any differential signals. These differential signals may be for transmission of data, controlling or biasing power supplies, high voltage signaling, or employed in other transmission systems etc. One of ordinary skill in the art will appreciate that a DUT 110 employing differential signaling encompasses a wide range for devices and the examples provided herein are included for purposes of explanation and should not be considered limiting. The DUT 110 includes differential pair 111 which are a pair of output pins that can be used to tap into the differential signal in the DUT 110 for testing purposes. The differential pair 111 include a signal pin 111a and a reference pin 111b. The differential signal 161 is a signal encoded as the difference between the signal traversing the signal pin 111a and the reference signal traversing the reference pin 111b.

Adaptor 120 is a differential connector to RF adaptor and is hence a device structured to interface between the pins/leads from the DUT's test points and a controlled impedance coaxial connection. Adaptor 120 is structured to interface with the pins/leads of differential pair 111 and transmit the differential signal 161 to probe 130. Specifically, adaptor 120 includes a pair of contacts that connect to an RF connector. The RF connector is selected to interface with the probe 130. The central contact of the adapter 120, which connects to the signal pin 111a, is connected to the center pin contact of the RF connector. Further, the adaptor 120 includes a reference contact, which connects to the reference pin 111b, and is connected to the outer shield contact of the RF connector. The adaptor 120 is further structured to abut the DUT 110 when interfacing with the differential pair 111 in order to shield/isolate the differential signals 161 from common mode or other ambient electrical interference occurring between the DUT 110 and the RF connector. The adaptor 120 is further structured to provide physical support for the differential pair 111. Specifically, the adaptor 120 maintains the differential pair 111 in a controlled position relative to each other and relative to RF connector and a corresponding coaxial connection, causing the entire connection to maintain a controlled impedance. The adaptor 120 may also include securing elements structured to secure reference pin 111b to the reference contact and/or to secure the signal pin 111a to the central contact. The adaptor 120 also includes a protective layer structured to protect the adaptor 120 and the coupled differential pair 111 during use. The adaptor 120 may or may not be soldered to the differential pair 111. The differential pair 111 may employ round or square pins or short wire leads, and the adaptor 120 is structured accordingly to engage with the pins/leads as needed. In some embodiments, the adaptor 120 includes an attenuator between the central and/or reference contacts and the RF connector to adjust the gain of the differential signals 161 to increase the acceptable input signal range and to better electrically isolate the DUT 110 system from the host 150.

Probe 130 is device structured to couple to adaptor 120 at the RF connector and communicate the differential signals 161 toward accessory 140. Probe 130 includes a coaxial cable with a probe RF connector to mate with the adaptor's RF connector. Specifically, probe 130 contains a coaxial cable with a center conductor and an outer shield. Probe 130 may also be constructed using a twisted pair and may be shielded. In some embodiments, the probe 130 includes an attenuator (e.g. if adaptor does not employ an attenuator). Further, the probe 130 includes a plurality of magnetic elements (e.g. ferrites) surrounding the coaxial cable and spaced along the length of the cable. The ferrites reduce common mode interference. The magnetic elements are separated by gaps, which are filled with elastomeric elements. The elastomeric elements are compressible, which allows the probe to bend and prevent adjacent magnetic elements from pressing together (e.g. reducing wear and preventing stress fractures). The probe 130 is structured to couple to, and propagate the differential signals 161 to accessory 140. In some embodiments, the probe 130 also includes an EEPROM containing probe 130 specifications, for example the resistance in the probe tip, tip attenuation, frequency response, and/or other parameters specific to probe 130.

Accessory 140 is any device structured to sense and/or precondition the differential signals 161 for host 150. The accessory 140 may include a sensor head for sensing the differential signals 161, a controller for preconditioning the differential signals 161, or combinations thereof. For example, the accessory 140 may obtain information from the EEPROM to adjust the gain of the signals 161 to compensate for losses naturally occurring when the differential signals 161 traverse the probe 130. Accessory 140 is designed to deliver the differential signals 161 to the host 150 while maintaining substantially the same electrical properties as the differential signals 161. Specifically, the accessory 140 is designed to minimize noise injected into the signals 161 while traversing the differential pair 111, adaptor 120, and probe 130.

Host 150 is structured to couple to accessory 140 and receive the signals 161 for testing and/or measurement. For example, host 150 is an oscilloscope or other test system. Host 150 receives the differential signals 161 from the accessory 140 and may display them on a graticule for a user. Host 150 may also capture characteristics from the differential signals 161 in memory for further calculation and use by the user. Accordingly, the adaptor 120, probe 130, and accessory 140 are employed to allow the user to measure differential signals 161 that are substantially identical to the differential signals 161 obtained from the DUT 110.

Figure 2:
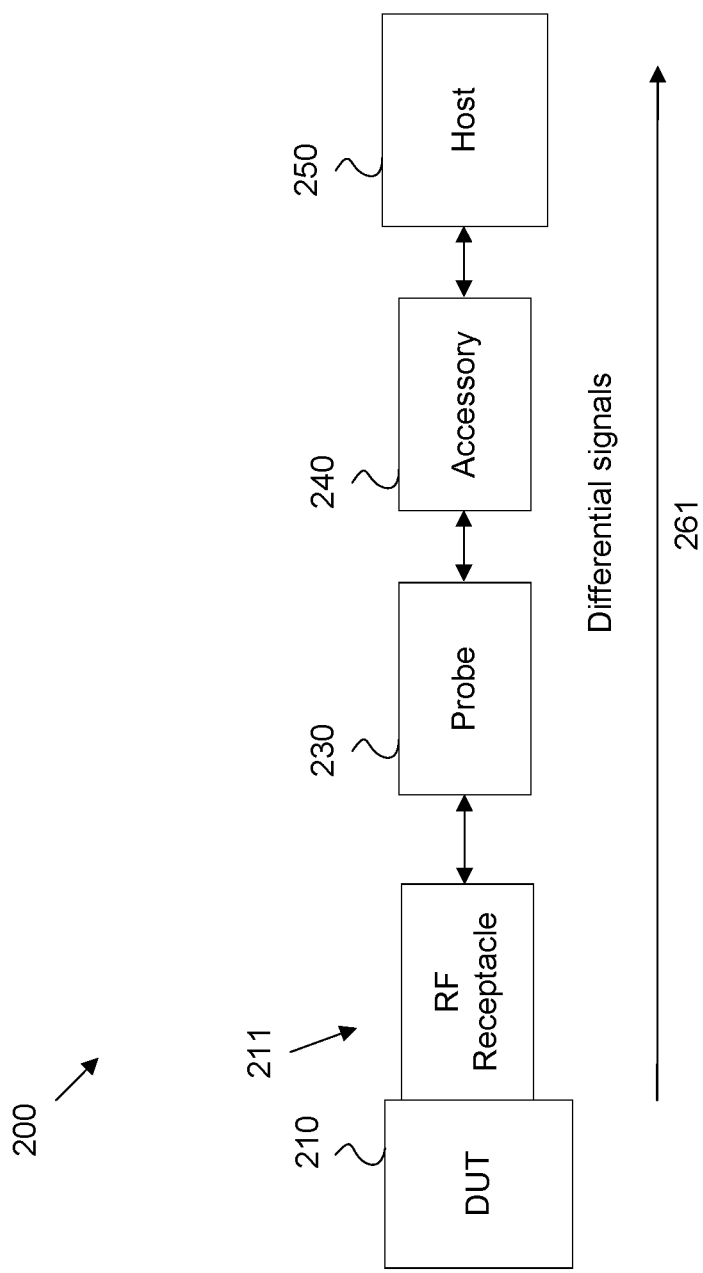
FIG. 2 is a schematic diagram of another embodiment of a test and measurement system.

FIG. 2 is a schematic diagram of another embodiment of a test and measurement system 200, which is similar to system 100. System 200 includes a DUT 210, a probe 230, an accessory 240, and a host 250 structured to conduct differential signals 261, which are substantially similar to DUT 110, probe 130, accessory 140, host 150, and differential signals 161, respectively. Unlike system 100, DUT 210 includes a mating RF receptacle 211 instead of differential pair 111. The RF receptacle 211 includes a coaxial connector for conducting a differential signal and is structured to coupled directly with probe 230 without the need of an intervening adaptor. Accordingly, probe 230 can be employed without the use of an adaptor such as adaptor 120.

Figure 3:
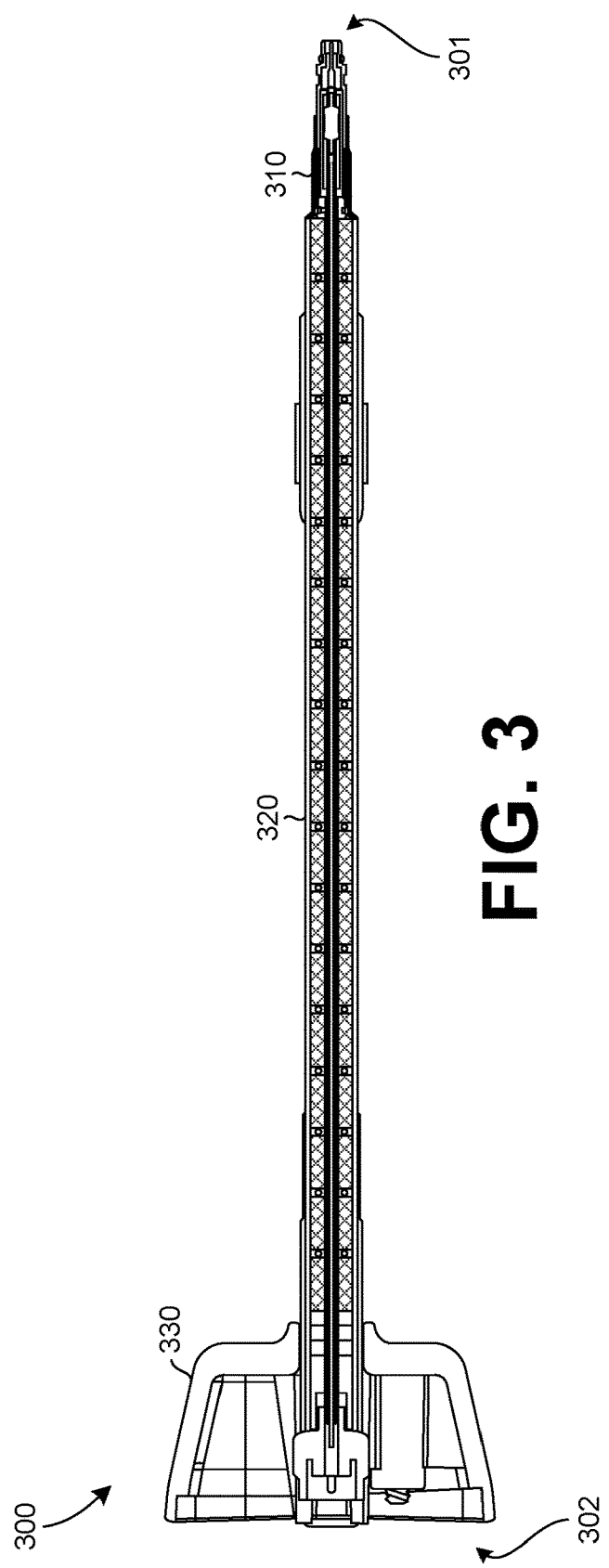
FIG. 3 is a cross sectional view of an embodiment of a flexible resistive tip cable assembly for differential probing.

FIG. 3 is a cross sectional view of an embodiment of a flexible resistive tip cable assembly 300 for differential probing (e.g. a probe with a probe tip). The cable assembly 300 is an example embodiment of the probe 130. The cable assembly 300 includes a probe RF connector 310, a coaxial cable 320, and a testing connection assembly 330. The probe RF connector 310 is positioned at a proximate end 301 of the cable assembly 300 and the testing connection assembly 330 is positioned at a distal end 302 of the cable assembly 300. The probe RF connector 310 is electrically coupled to the testing connection assembly 330 via the coaxial cable 320. The probe RF connector 310 is further configured to couple to an adaptor or RF receptacle, such as adaptor 120 or RF receptacle 211. Accordingly, the probe RF connector 310 is structured to receive a RF differential signal, such as a differential signal 161, from an adaptor, and the coaxial cable 320 is structured to conduct the RF differential signal between the probe RF connector 310 and the testing connection assembly 330. The testing connection assembly 330 is structured to couple to a testing device, such as accessory 140 and/or host 150. As such, the RF differential signal can be conducted from the adaptor to the accessory/host via the flexible resistive tip cable assembly 300. The flexible resistive tip cable assembly 300 employs magnetic elements, such as ferrites, positioned along the coaxial cable 320 to reduce/attenuate the common mode interference from coupling into the differential signal. Complete enclosure in magnetic elements would render the cable 320 rigid, so small gaps are positioned between the magnetic elements to allow for cable 320 movement. In some embodiments, compressible elastomeric elements are positioned in the gaps to allow for flexible cable 320 movement and prevent grinding of the magnetic elements during use. The magnetic elements and the elastomeric elements may be positioned continuously along a length of the cable 320 from the probe RF connector 310 to a test RF connector in the testing connection assembly 330 for maximum rejection of the common mode interference. Example embodiments of components suitable for use in the flexible resistive tip cable assembly 300 are discussed more fully below.

Figure 4:
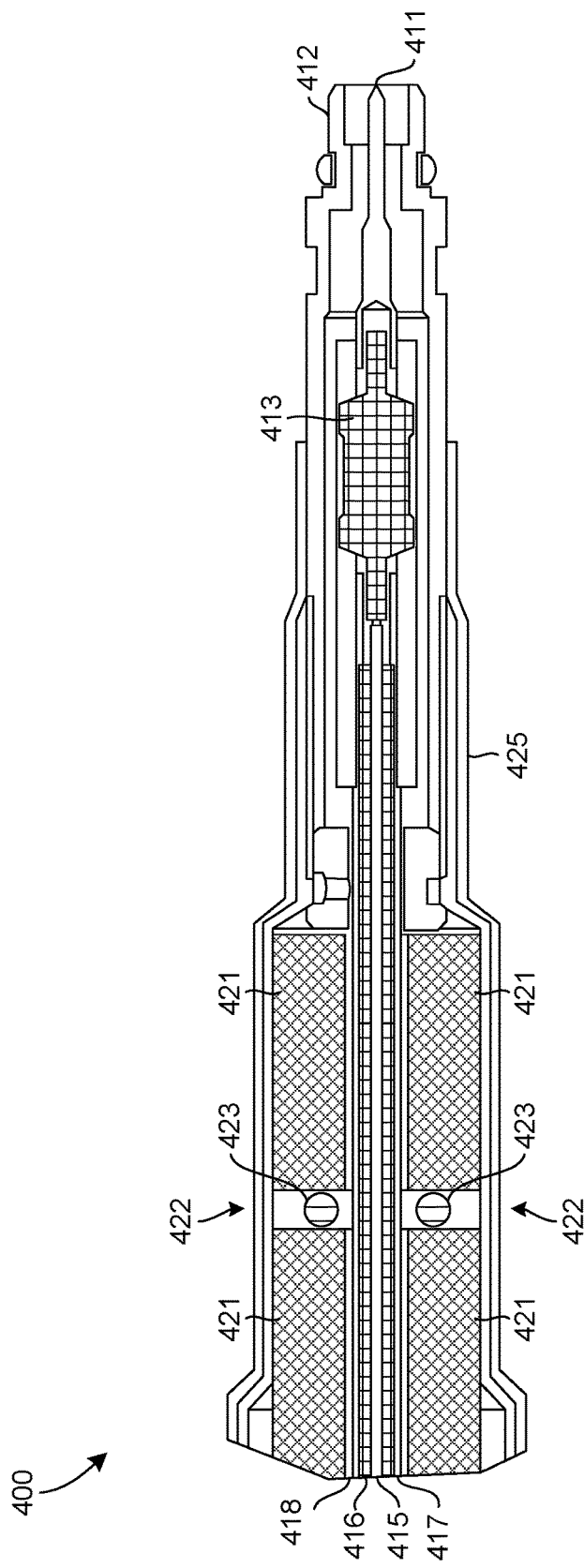
FIG. 4 is a cross sectional view of an embodiment of a probe RF connector for a flexible resistive tip cable assembly.

FIG. 4 is a cross sectional view of an embodiment of a probe RF connector 400 for a flexible resistive tip cable assembly, such as flexible resistive tip cable assembly 300. Probe RF connector 400 is an example embodiment of probe RF connector 310. Probe RF connector 400 includes a signal contact 411 and a reference contact 412 structured as an RF connector positioned at the proximate end (e.g. proximate end 301) of a flexible resistive tip cable assembly. The RF connector is capable of coupling with an adaptor or RF receptacle, such as adaptor 120 or RF receptacle 211, and is structured to receive a differential signal. The signal contact 411 conducts the signal of a differential signal, and the reference contact 412 conducts the reference signal of the differential signal. The contacts 411-412 make up the RF connector and can be spaced as needed to embody multiple connector types, such as a Sub-Miniature Push-On (SMP) connector, a Sub-Miniature Version A (SMA) connector, a Micro-Miniature Coaxial (MMCX) connector, etc.

The probe RF connector 400 also includes a center conductor 415 electrically coupled to the signal contact 411 and a reference conductor 417 electrically coupled to the reference contact 412. The center conductor 415 conducts the signal from the signal contact 411 along the coaxial cable (e.g. coaxial cable 320) and the reference conductor 417 conducts the reference signal from the reference contact 412 along the coaxial cable. The signal contact 411, center conductor 415, reference contact 412, and reference conductor 417 may be made of any material capable of conducting electrical signals, for example copper, copper plated steel, brass, gold, gold plated brass, etc. The center conductor 415 is surrounded by an insulating sleeve 416, and the reference conductor 417 surrounds the insulating sleeve 416. The insulating sleeve 416 is as an insulator/dielectric that keeps the center conductor 415 from electrically shorting to the reference conductor 417. The insulating sleeve 416 may be made of any insulating material that provides the sufficient electrical insulation for the desired task, such as polyethylene, Polytetrafluoroethylene (PTFE) (e.g. Teflon), etc.

The probe RF connector 400 also comprises an attenuator 413. The attenuator 413 is electrically coupled between the center conductor 415 of the cable and the signal contact 411 of the RF connector to reduce electrical loading in the RF differential signal. The attenuator 413 reduces the gain associated with the differential signal, which increases the allowable input signal range of the test system (e.g. accessory 140 and/or host 150). The attenuator 413 also electrically isolates the test system from extraneous currents from the DUT. In some embodiments, the attenuator 413 could be included in another component, such as an adaptor. As such, attenuator 413 may not be present in some embodiments.

The center conductor 415, insulating sleeve 416, and reference conductor 417 act as a coaxial cable for conducting the differential signal. A plurality of magnetic elements 421 are positioned along the length of the coaxial cable. The magnetic elements 421 are structured to isolate the differential signal in the coaxial cable from common mode interference. Specifically, the magnetic elements 421 act as a common mode choke, which reduces common mode electromagnetic interference currents without causing signal degradation in differential signals. The magnetic elements 421 may be made of any suitable magnetic material, such as ferrite. A ferrite is a ceramic compound made of a combination of transition metals and oxygen. A ferrite is ferromagnetic but non-conductive. The magnetic elements 421 may be embodied as magnetic rings that encircle the coaxial cable. Specifically, the coaxial cable, and hence the center conductor 415, insulating sleeve 416, and reference conductor 417, has a length and a diameter. The magnetic elements 421 are positioned to surround the diameter of the coaxial cable along the cable's length. In some embodiments, the magnetic elements 421 directly abut the reference conductor 417. In other embodiments, coaxial cable includes an insulating sleeve 418, which is substantially similar to insulating sleeve 416, that surrounds and acts as a protective layer for the reference conductor 417. In such cases, the magnetic elements 421 abut the insulating sleeve 418 surrounding the cable.

The magnetic elements 421 are each separated from adjacent magnetic elements 421 by gaps 422. The gaps 422 allow the cable to bend, as a solid length of magnetic element 421 is inflexible. The gaps 422 are minimized to reduce the surface area of the cable without a common mode choke. However, the gaps 422 are large enough to allow the cable to bend without grinding the magnetic elements 421 together, which would damage the magnetic elements 421 over time. In an example embodiment, the length of the gaps 422 are about a third of the height of the magnetic elements 421 to prevent the magnetic elements 421 from rubbing together when the cable is bent.

In some embodiments, a plurality of elastomeric elements 423 are positioned in the gaps 422 between the magnetic elements 421. The elastomeric elements 423 are compressible and provide support to the cable. Specifically, the elastomeric elements 423 allow the cable to bend in a controlled manner while and prevent adjacent magnetic elements 421 from coming into contact with each other. An elastomeric element 423 is made of a polymer with both viscosity and elasticity. While a circular elastomeric element 423 is depicted (e.g. a spherical bead), elastomeric coatings or other shapes may also be employed.

The probe RF connector 400 may also be partially surrounded by a protective layer 425. The protective layer 425 is an insulating jacket that protects the components of probe RF connector 400 and also provides additional structure to the probe RF connector 400. The protective layer 425 does not extend over the signal contact 411 the reference contact 412 (e.g. the RF connector), which allows the RF connector to mate with adjacent components, such as the adaptor.

Figure 5:
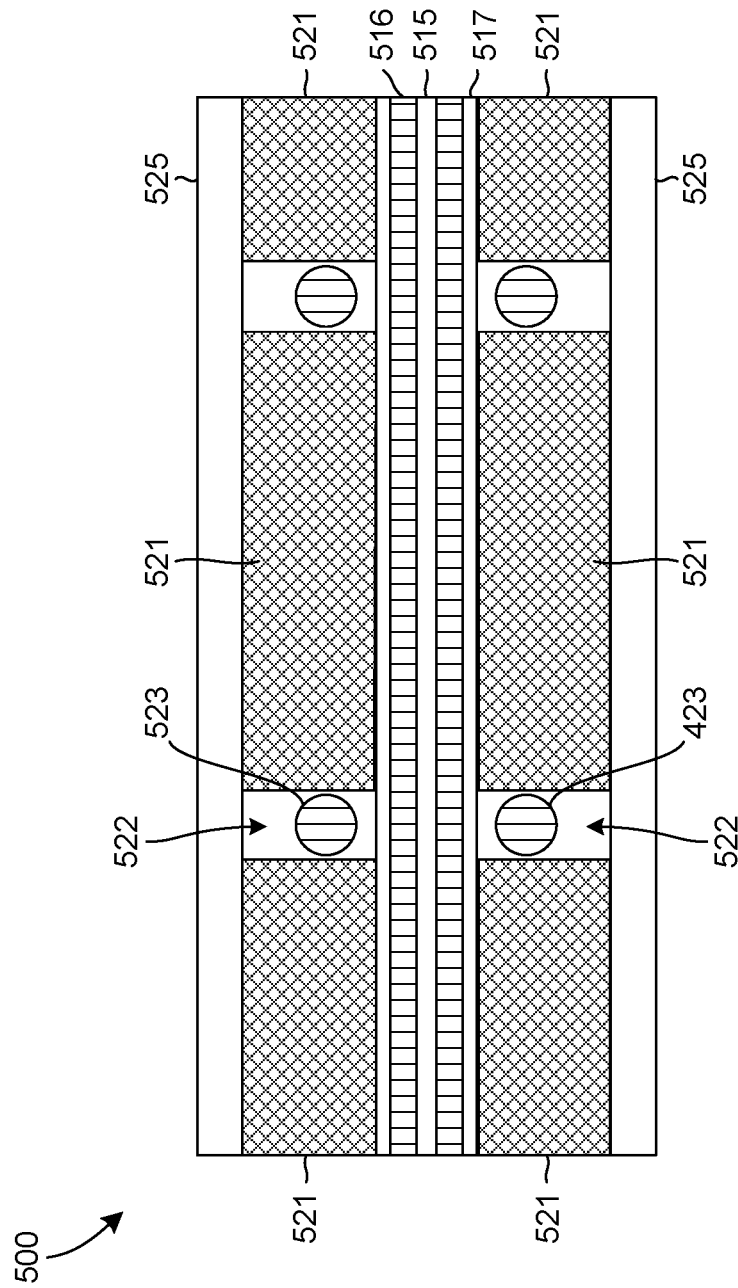
FIG. 5 is a cross sectional view of an embodiment of a coaxial cable for a flexible resistive tip cable assembly.

FIG. 5 is a cross sectional view of an embodiment of a coaxial cable 500 for a flexible resistive tip cable assembly, such as flexible resistive tip cable assembly 300. Coaxial cable 500 includes a center conductor 515, an insulating sleeve 516, a reference conductor 517, magnetic elements 521, gaps 522, elastomeric elements 523, and a protective layer 525, which are substantially similar to center conductor 415, insulating sleeve 416, reference conductor 417, magnetic elements 421, gaps 422, elastomeric elements 423, and protective layer 425, respectively. Coaxial cable 500 is an example embodiment of coaxial cable 320 and is structured to electrically couple a probe RF connector, such as connectors 310 and/or 400, to testing connection assembly, such as assembly 330 and/or 600. Coaxial cable 500 is depicted to show the magnetic elements 521 directly abutting the reference conductor 517. However, in some embodiments, the magnetic elements 521 abut an insulating sleeve surrounding the reference conductor 517 as shown in FIG. 4.

Figure 6:
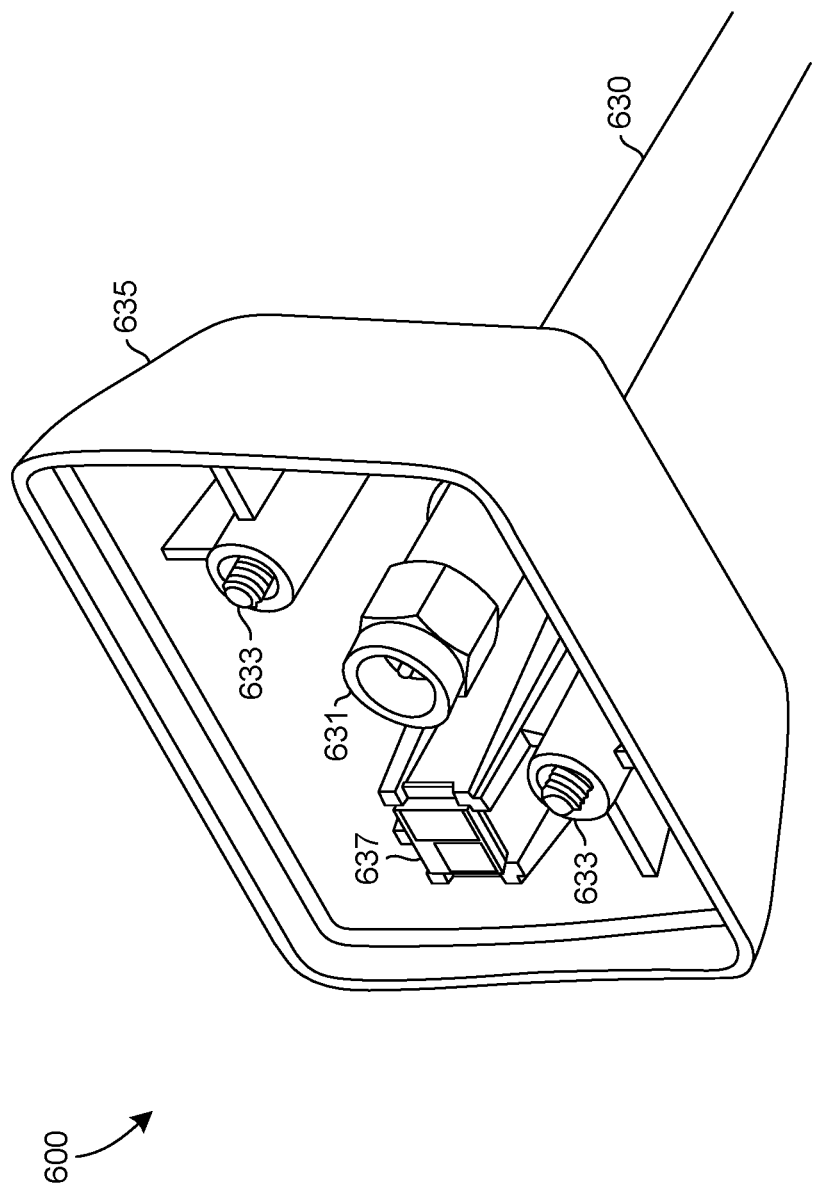
FIG. 6 is a perspective view of an embodiment of a testing connection assembly for a flexible resistive tip cable assembly.

FIG. 6 is a perspective view of an embodiment of a testing connection assembly 600 for a flexible resistive tip cable assembly, such as flexible resistive tip cable assembly 300. Testing connection assembly 600 is an example embodiment of a testing connection assembly 330. Testing connection assembly 600 may also be referred to as the sensor head. Testing connection assembly 600 includes a coaxial cable 630, which is substantially similar to coaxial cable 320 and/or 500, conducting a differential signal. Testing assembly 600 further includes a test RF connector 631 coupled to the coaxial cable 630 at the distal end (e.g. distal end 302) of the flexible resistive tip cable assembly. The test RF connector 631 is structured to electrically couple the coaxial cable 630 to an accessory and/or host, such as accessory 140 and host 150, respectively. The test RF connector 631 is further structured to conduct the differential signal from the DUT to the accessory/host for testing. The test RF connector 631 may embody multiple connector types, such as a SMP connector, a SMA connector, a MMCX connector, etc.

Testing connection assembly 600 also includes a nose cone 635 with fasteners 633. Nose cone 635 is structured to couple to the accessory and/or host and be held in place via fasteners 633. The nose cone 635 provides safety features by preventing users from coming into contact with electrical current while the probe is in use. The nose cone 635 can be made of any non-conductive material suitable for safety purposes, such as plastic, rubber, or other non-conductive materials. The fasteners 633 are structured to hold the nose cone 635 in place during use. While threaded screws are shown, any suitable fastener may be employed as a fastener 633.

In some embodiments, the testing connection assembly 600 includes a memory 637, which may include an EEPROM. During manufacture, the flexible resistive tip cable assembly is tested to determine various electrical parameters of the cable assembly, the results of which are loaded into the memory 637. In one embodiment, the attenuation associated with the attenuator (e.g. attenuator 413) and/or associated with the entire flexible resistive tip cable assembly is determined and loaded into the memory 637. When the testing connection assembly 600 is coupled to the accessory/host, the accessory/host can read the data stored in the memory 637. The accessory/host can then employ the stored attenuation and/or parameters during signal testing. For example, a coupled accessory may adjust a signal received via the flexible resistive tip cable assembly to account for attenuation by the attenuator, resulting in a signal of greater quality at the host without requiring user intervention.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect or embodiment, that feature can also be used, to the extent possible, in the context of other aspects and embodiments.

Also, when reference is made in this application to a method having two or more defined steps or operations, the defined steps or operations can be carried out in any order or simultaneously, unless the context excludes those possibilities.

Although specific embodiments of the invention have been illustrated and described for purposes of illustration, it will be understood that various modifications may be made without departing from the spirit and scope of the invention. Accordingly, the invention should not be limited except as by the appended claims.

We claim:

1. A flexible resistive tip cable assembly comprising:
    a probe Radio Frequency (RF) connector structured to receive a RF differential signal;
    a testing connection assembly; and
    a coaxial cable structured to conduct the RF differential signal between the probe RF connector and the testing connection assembly, the coaxial cable including:
        a cable for conducting the differential signal, and
        a plurality of magnetic elements positioned along a length of the cable and structured to isolate the differential signal from common mode interference, wherein each magnetic element is separated from adjacent magnetic elements by a gap and the cable further includes a plurality of elastomeric elements, and wherein at least one of the elastomeric elements is positioned in each gap to provide cable flexibility.

2. The cable assembly of claim 1, wherein at least one of the magnetic elements abuts a protective layer surrounding the cable.

3. The cable assembly of claim 1, wherein the cable includes
 a center conductor surrounded by an insulating sleeve for conducting a signal of the RF differential signal, and
 a reference conductor surrounding the insulating sleeve for conducting a reference signal of the RF differential signal, and
 wherein at least one of the magnetic elements abuts the reference conductor.

4. The cable assembly of claim 1, wherein the plurality of magnetic elements and the elastomeric elements are positioned continuously along the length of the cable from the probe RF connector to the testing connection assembly.

5. The cable assembly of claim 1, wherein the probe RF connector includes:
 an RF connector structured to receive the differential signal, and
 an attenuator electrically coupled to the probe RF connector and the cable.

6. The cable assembly of claim 1, wherein the testing connection assembly includes an Electrically Erasable Programmable Read Only Memory (EEPROM), and wherein the EEPROM includes an attenuation associated with the flexible resistive tip cable assembly for use in signal testing by a device coupled to the testing connection assembly.

7. The cable assembly of claim 1, wherein the plurality of magnetic elements are ferrites that each encircle the cable.

8. A cable comprising:
 a center conductor structured to conduct a signal of a Radio Frequency (RF) differential signal, the center conductor including a length and a diameter;
 a reference conductor structured to conduct a reference signal of the RF differential signal, the reference conductor including a length and a diameter;
 a plurality of magnetic rings positioned along the length of the reference conductor and the length of the center conductor to isolate the RF differential signal from common mode interference, wherein each magnetic ring is positioned to surround the diameter of the center conductor and the diameter of the reference conductor, and wherein the magnetic rings are each separated by a gap; and
 a plurality of elastomeric elements positioned in the gaps between the magnetic rings;
 the cable further comprising a probe RF connector coupled to a proximate end of the cable and a test RF connector coupled to a distal end of the cable, wherein the plurality of magnetic rings and the elastomeric elements are positioned continuously along a length of the cable from the probe RF connector to the test RF connector.

9. The cable of claim 8, further comprising an attenuator electrically coupled to the center conductor to reduce electrical loading in the RF differential signal.

10. The cable of claim 8, further comprising an insulating sleeve surrounding the center conductor, wherein the reference conductor surrounds the insulating sleeve, wherein the cable further comprises a protective layer surrounding the reference conductor, and wherein the magnetic rings abut the protective layer.

11. The cable of claim 8, wherein the plurality of magnetic rings are ferrites.

12. The cable of claim 8, wherein the magnetic rings abut the reference conductor.

* * * * *